(12) United States Patent
Balakrishnan et al.

(10) Patent No.: US 12,695,450 B2
(45) Date of Patent: Jul. 28, 2026

(54) PARALLELING POWER SWITCHES

(71) Applicant: Power Integrations, Inc., San Jose, CA (US)

(72) Inventors: Vikram Balakrishnan, San Francisco, CA (US); Michael Anton Brumann, Biel (CH); Matthias Peter, Bern (CH); Andreas Volke, Soest (DE)

(73) Assignee: Power Integrations, Inc., San Jose, CA (US)

( * ) Notice: Subject to any disclaimer, the term of this patent is extended or adjusted under 35 U.S.C. 154(b) by 50 days.

(21) Appl. No.: 18/903,175

(22) Filed: Oct. 1, 2024

(65) Prior Publication Data

US 2025/0112633 A1      Apr. 3, 2025

(30) Foreign Application Priority Data

Oct. 2, 2023      (EP) ..................................... 23201165

(51) Int. Cl.
*H03K 17/28* (2006.01)
(52) U.S. Cl.
CPC .................................... *H03K 17/28* (2013.01)
(58) Field of Classification Search
CPC ...................................................... H03K 17/28
USPC ................................................. 327/108–112
See application file for complete search history.

(56) References Cited

U.S. PATENT DOCUMENTS

| | | | |
|---|---|---|---|
| 7,071,661 B2 | 7/2006 | Thalheim | |
| 2012/0098577 A1* | 4/2012 | Lobsiger | H03K 17/082 |
| | | | 327/109 |
| 2016/0126822 A1 | 5/2016 | Lyle et al. | |
| 2016/0294275 A1 | 10/2016 | Pronovost et al. | |
| 2017/0104338 A1 | 4/2017 | Hopperdietzel | |
| 2018/0013416 A1 | 1/2018 | Sicard | |
| 2023/0188130 A1 | 6/2023 | Bondade et al. | |

OTHER PUBLICATIONS

International Search Report and Written Opinion in International Appln. No. PCT/IB2024/52207, mailed on May 30, 2024, 17 pages.
Extended European Search Report in European Appln. No. 23201165. 0, mailed on Jun. 5, 2024, 12 pages.
Partial European Search Report in European Appln. No. 23201165. 0, mailed on Mar. 13, 2024, 13 pages.

* cited by examiner

*Primary Examiner* — Tomi Skibinski
(74) *Attorney, Agent, or Firm* — Fish & Richardson P.C.

(57) ABSTRACT

A power switching system includes a plurality of power switching units each including a respective power switch, a communication system configured to convey a system-wide switching command to the power switching units along a communication channel, and circuitry, included in each of the power switching units, that is configured to delay execution of the system-wide switching command by a delay.

20 Claims, 6 Drawing Sheets

PARALLELING POWER SWITCHES

CROSS-REFERENCE TO RELATED APPLICATION

This application claims priority under 35 USC § 119 to European Patent Application No. 23201165.0, filed on Oct. 2, 2023, in the European Union Intellectual Property Office, the contents of which is incorporated by reference herein in its entirety.

TECHNICAL FIELD

The present specification relates to paralleling of power switches.

BACKGROUND

Power switches are switching devices designed to switch relatively high voltages and currents. Examples of power switches include insulated gate bipolar transistors (IGBTs), metal-oxide-semiconductor field-effect transistors (MOS-FETs), high-electron-mobility transistors (HEMTs), and the like. These power switches are commonly made using semiconductor materials such as silicon, silicon carbide, gallium nitride, or other semiconductor materials. In some cases, individual power switches will include more than one physical transistor. For example, two transistors in a cascode configuration can form a single power switch.

In practice, individual power switches are generally associated with dedicated control, communication, and fault protection circuitry. The provision of drive signals to the power switch is handled by the associated circuitry.

Even when individual power switches have device characteristics that are tailored to switching relatively high voltages and currents, individual power switches are often incapable of meeting the demands of some applications. To address such demands, multiple power switches are often paralleled such that each power switch conducts only a portion of the total current. In general, the total current that flows through an assembly of power switches is monitored.

Also, the voltages between the main terminals of individual power switches (i.e., the collector-to-emitter voltages or drain-to-source voltages) may be monitored for various purposes. For example, dedicated fault protection circuitry may monitor such voltages for an individual power switch.

DESCRIPTION OF DRAWINGS

Like reference symbols in the various drawings indicate like elements.

Figure 1:
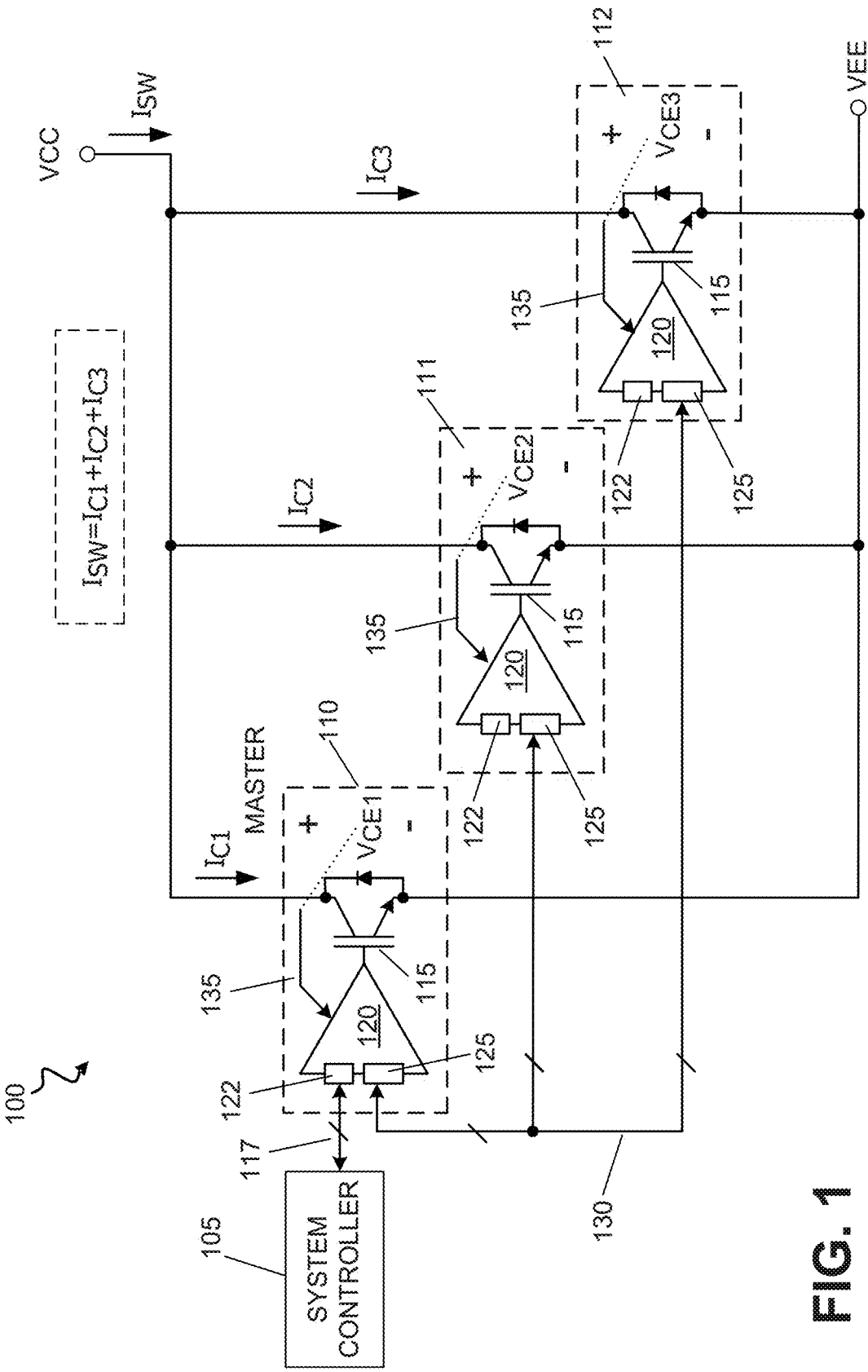
FIG. 1 is a schematic representation of a system in which switching of the different power switches is coordinated to switch a total current and a voltage.

For didactic purposes, the detailed description is cast in terms of insulated gate bipolar transistor (IGBT) power switches. However, corresponding teachings can be applied to a variety different enhancement- or depletion-mode devices (e.g., bipolar junction transistors (BJTs), metal-oxide-semiconductor field-effect transistors (MOSFETs), or high-electron-mobility transistors (HEMTs)) with electron or hole charge carriers, alone or in combination with other transistors. The devices can be implemented in silicon, silicon carbide, gallium nitride, or other semiconductor materials.

DETAILED DESCRIPTION

The switching of a plurality of power switches can be coordinated. This coordination can be used to achieve any of a number of different objectives and advantages.

For example, in some implementations described herein, the switching of power switches is tailored to ensure that the current carried by the different switches is balanced. In balanced current sharing, the total current is divided relatively equally among the individual switches. The more evenly that current is distributed amongst the individual power switches, the fewer switches that are needed to switch a given total current while ensuring safe operation.

By way of example, suppose that 3000 A are to be switched using power switches that have a rated or nominal current of 650 A. The rated or nominal current of a power switch can be defined as a maximum continuous DC current that can safely flow through the power switch at defined conditions, e.g., at a defined maximum junction temperature. Returning to the example, if current sharing is not balanced, there will likely be relatively large differences between the currents that are switched by the different switches. For example, if one were to attempt to operate all of the switches at a target current of 600 A, a 15% variation in the current switched by the different power switches would leave one power switch conducting 510 A and another conducting 690 A. It is likely that the current through at least one switch would exceed the rated collector current. Designers will accommodate this variability by adding additional switches so that the target current carried by any given switch remains below the rated collector current. For example, rather than operating five switches at a target current of 600 A, six switches at a target current of 500 A could be used.

Alternatively, if the current were distributed more evenly and current sharing better balanced (e.g., with only a 5% variation in the current switched by the different switches from the target current of 600 A), then five switches at a target current of 600 A could be used. Further, a relatively large margin of safety relative to the maximum current rating of the switches can be maintained.

As another example, in some implementations described herein, the switching of power switches is tailored to ensure that the current carried by the different switches is unbalanced. Contrary to balanced current sharing, unbalanced current sharing distributes the total current unevenly among the power switches. The current can be distributed unevenly even if the switches nominally have the same power rating (i.e., the same voltage and current capacity) or are of the same type (i.e., are the same to within manufacturing tolerances).

In some implementations described herein, intentional current unbalancing can accommodate the deviations between devices. The deviations can either be inherent in the switches (i.e., in the switches as manufactured) or can arise over time. For example, the temperature of a power switch may change or the structure of a power switch may degrade over time. Regardless of their cause, deviations can be accommodated, e.g., to more closely tailor the switching capacity to the requirements of an operational context or to respond to conditions that arise during operation.

By way of example, again suppose that 3000 A are to be switched using power switches that have a rated current of 650 A. Initially, the current is distributed nearly evenly, e.g., amongst five switches with only a 5% variation in the current switched by the different switches from the target current of 600 A. However, at some point during the operational lifespan of the switches, assume that one of the switches begins to degrade. For example, thermal or mechanical fatigue can degrade the performance of one of the switches.

The lifespan of this degrading switch—and hence the lifespan of the system of switches—can be extended by reducing the current that is carried through that switch. For example, the target current through the degrading power switch can be reduced to 540 A at the same time that the target current through the other four switches is increased to 615 A. If the current through the other four switches remains well-balanced with only a 5% variation, this leaves all of them below their maximum current rating of 650 A and reduces the wear on the degrading switch. The lifespan of the system as a whole may be extended.

In some implementations described herein, the switching of the different power switches is actively tailored on a switching-cycle-by-switching-cycle basis. Deviations from desired balancing/unbalancing can be addressed quickly.

In some implementations described herein, the switching of the different power switches is actively tailored using information that is already measured for other reasons, for example, to limit overvoltage transients during turn-off switching events. For example, measurements of the voltages between the main terminals of individual power switches can be used to coordinate the switching of the different power switches within a system. In some cases, the voltages between the main terminals may be sensed directly. In others, the voltages between the main terminals may be sensed indirectly, e.g., by measuring current flow through an impendence network.

FIG. 1 is a schematic representation of a system 100 in which switching of the different power switches is coordinated to switch a total current ISW and a voltage VCC. System 100 includes a plurality of individual individually-addressable switching units 110, 111, 112. Each switching unit 110, 111, 112 includes an IGBT power switch 115 and associated switching controller and driver circuitry 120. In operation, the switching of IGBT power switches 115 in system 100 is coordinated to achieve a desired distribution of the current that flows through IGBT power switches 115.

In more detail, the illustrated implementation of system 100 includes three switching units 110, 111, 112. A first of these units, namely, unit 110, acts as a "master" and is configured to coordinate the switching of switching units 110, 111, 112 with adjustments that are addressed to individual power switches. Further, switching unit 110 can be coupled to a system controller 105. System controller 105 is a component that is responsible for controlling—with system-level commands that are addressed to system 100 as a whole—the timing of the power switching in system 100. System controller 105 can be implemented utilizing a microcontroller or a field programmable gate array (FPGA).

System controller 105 is communicatively coupled by one or more communication channels 117 to switching unit 110. System controller 105 is configured to send signals to switching unit 110 along channel(s) 117. The signals specify when IGBT power switches 115 are to switch from open, essentially non-conductive OFF states to closed, current-conductive ON states and vice-versa. However, the switching commands are for system 100 as a whole, rather than individually addressed to any one of switching units 110, 111, 112. Switching unit 110 is configured to receive those system-wide switching commands and both implement them itself and relay them to other switching units 111, 112.

In addition to these system-wide switching commands, switching unit 110 sends timing adjustments that are to be made to these system-wide switching commands to each switching unit 111, 112. In general, switching unit 110 will also apply its own timing adjustments to system-wide switching commands. The adjustments are individually tailored and particular to each switching unit 110, 111, 112 and, as discussed further below, specify relatively fine adjustments the timing of the OFF/ON and/or ON/OFF transitions of the IGBT power switches 115 in those switching units. The adjustments further refine the switching in switching units 110, 111, 112 with higher precision to achieve a desired distribution of the current that flows through IGBT power switches 115. Although the durations of the relatively fine adjustments are in theory unlimited, as a practical matter, the durations of the adjustments are generally only a fraction less than one of the inherent rise time or fall time of the gate for a given set of operating conditions in system 100. For example, in some implementations, the adjustments can be between 0 and 1000 nanoseconds, for example, between 0 and 300 nanoseconds in typical operating conditions.

In general, but not necessarily, communication along channel(s) 117 is bidirectional and switching unit 110 will also convey information to system controller 105. Examples of the information conveyed to system controller 105 from master unit 110 can include error/fault information and operational information (e.g., temperature).

In the illustrated implementation, switching controller and driver circuitry 120 in switching units 110, 111, 112 includes extra-switching-unit communication circuitry 122 and intra-switching-unit communication circuitry 125. Extra-switching-unit communication circuitry 122 is circuitry that is configured to exchange information with components other than the switching units. For example, in switching unit 110, extra-switching-unit communication circuitry 122 is configured to exchange information with system controller 105 over channel(s) 117. Although each switching unit 110, 111, 112 in the illustrated implementation includes extra-switching-unit communication circuitry 122, this is not necessarily the case and in some implementations, extra-switching-unit communication circuitry 122 can be omitted from one or both of slave switching units 111, 112.

Intra-switching-unit communication circuitry 125 is circuitry that is configured to exchange commands and information with other switching units in system 100 over one or more channels 130. The communication along channels 130 is bidirectional. As discussed further below, the exchanged information can include operational details that are communicated from slave switching units 111, 112 to master switching unit 110 as well as signals that specify adjustments to the timing of switching transitions of the IGBT power switches 115 in switching units 111, 112.

In addition to communication circuitry 122, 125, each switching controller and driver circuitry 120 includes circuitry for driving the respective IGBT power switch 115 between ON and OFF states and circuitry for controlling that driving. Driving functionality is generally implemented using a totem-pole (pull-up, pull-down) driver, although direct drive and other drivers are possible. The control functionality can include timing adjustment and fault protection functionality (e.g., overcurrent protection, overvoltage protection, or the like) that relies upon sensing the collector-to-emitter voltage VCE of IGBT power switches 115. Each switching unit 110, 111, 112 thus includes a VCE sense line 135 that allows switching controller and driver circuitry 120 to sense the collector-to-emitter voltage VCE of IGBT power switches 115. As discussed further below, switching controller and driver circuitry 120 can be configured to determine the time(s) needed for the collector-to-emitter voltage VCE to fall and/or rise to one or more threshold voltage levels, value(s) of the collector-to-emitter voltage VCE at one or more defined times, or both such time(s) and such value(s).

In many implementations, communication circuitry 122, 125 is galvanically isolated from IGBT's 115 and their associated drive circuitry, as well as VCE sense line 135. In these cases, switching controller and driver circuitry 120 includes internal communication circuitry and components (e.g., optical couplers, transformers, capacitors, as well as the associated switching circuitry) for bidirectional communications across the galvanic isolation. The bidirectional communications can occur over a bidirectional communications channel or two (or more) unidirectional communications channels that communicate in opposite directions. Amongst the communications are commands that encode switching instructions and data signals that encode VCE sense information.

In some implementations, system 100 can operate to adjust the timing of switching transitions of IGBTs 115 in switching units 110, 111, 112 on a switching-cycle-by-switching-cycle basis using VCE sense information collected during a previous switching cycle. For example, in operation, system controller 105 can transmit switching commands to switching unit 110 along channel(s) 117. The switching commands will generally indicate the time when IGBTs 115 are to be switched into and out of conduction. Switching controller and driver circuitry 120 receives the switching commands at extra-system communication circuitry 122. For the first such switching command (e.g., a first command after start-up or a reset after a fault condition), switching controller and driver circuitry 120 in switching unit 110 relays the switching command to switching units 110, 111, 112 using the intra-switching-unit communication circuitry 125 and channels 130. As an aside, by routing the switching command for switching unit 110 through the same intra-switching-unit communication circuitry 125 and channel 130 that conveys the switching command to switching units 111, 112, switching units 110, 111, 112 are all subject to the same propagation delay resulting from putting the switching command onto channel 130. In other words, switching units 110, 111, 112 all respond to the switching command on channel 130. The propagation delay associated with putting that switching command on channel 130 is the same.

In any case, switching units 110, 111, 112 receive the switching command on channel 130 and route the switching command through their respective switching controller and driver circuitry 120 to switch their respective IGBTs 115 into and out of conduction in response to and in accordance with the relayed switching command. Since each switching controller and driver circuitry 120 in the different switching units 110, 111, 112 is nearly identical, this too reduces differences in propagation delay. In some implementations, additional trimming circuitry could be included to further reduce any differences.

During the switching transitions between the conduction states, switching controller and driver circuitry 120 in each switching unit receives VCE sense information for the corresponding IGBT 115 over a respective VCE sense line 135. Each switching controller and driver circuitry 120 can be configured to measure the time(s) needed for the collector-to-emitter voltage VCE to fall and/or rise to one or more threshold voltage levels, value(s) of the collector-to-emitter voltage VCE at one or more defined times, or both such time(s) and such value(s).

The times or values can thus be measured during either or both of an ON/OFF transition or an OFF/ON transition. Further, the times or values characterize the actual current conduction through IGBTs 115 during such transitions. This contrasts with schemes in which parameters like the gate-to-emitter voltage VGE are sensed and current conduction is assumed to follow. In particular, the operational current-carrying behavior of IGBTs 115—which reflects manufacturing variability and temperature effects—is sensed. In any case, the determined times or values are transmitted from the switching controller and driver circuitry 120 in switching units 111, 112 to switching unit 110 over channel(s) 130 using intra-switching-unit communication circuitry 125.

In some implementations, clocks in the different switching units 110, 111, 112 can be synchronized, e.g., using phase locking. In some implementations, clocks on both primary and secondary sides of the switching units 110, 111, 112 can be synchronized. As discussed further below, the synchronized clocks can provide a common time reference-either for measurement of the time required for collector-to-emitter voltages VCE to cross a threshold in different switching units 110, 111, 112 or for defining the times at which values of the collector-to-emitter voltage VCE are to be measured. For example, in the contact of FIGS. 2A, 2B, 2C, 2D, the synchronized clocks can provide a common time reference for times A, C.

The switching controller and driver circuitry 120 in switching unit 110 determines relatively fine, higher precision adjustments that are to be made to the timing of the switching transitions of IGBT power switches 115 in switching units 110, 111, 112 in the next switching cycle. In an initial switching cycle, all of the adjustments will be delays. However, in subsequent cycles, delays can also be decreased. In some implementations, the adjustments can be resolved into discrete time steps, e.g., 1-10 nanosecond increments and are generally only a fraction of the inherent rise time or fall time of the gate for a given set of operating conditions. The adjustments are tailored to each switching unit 110, 111, 112. In some cases, the adjustment in the timing of the switching transitions for switching unit 110 will differ from the adjustment in the timing of the switching transitions for switching unit 111, which in turn will differ from the adjustment in the timing of the switching transitions for switching unit 112.

In some implementations, the adjustments are designed to approach a desired current distribution gradually over multiple switching cycles. For example, rather than using relatively large adjustments in an attempt to achieve a desired current distribution immediately in a next switching cycle, a more gradual adjustment that is expected to lead to a less-unbalanced current distribution can be applied in a next switching cycle. Likewise, a gradual adjustment that will not immediately achieve a desired current distribution can be applied in the subsequent switching cycle. Also, after an adjustment is applied, the times/values of the collector-to-emitter voltage VCE may indicate that the desired current distribution has been overshot. In other words, the current conducted by a switching unit may be too low before an adjustment is applied. After the adjustment applied, the current conducted by that same switching unit may be too high. In such cases, an adjustment in the opposite direction (i.e., a "reduced" or even "negative" adjustment) can be applied in a subsequent switching cycle.

In any case, signals that characterize the adjustments for switching units 111, 112 are transmitted from the switching controller and driver circuitry 120 in switching unit 110 to switching units 111, 112 over channel(s) 130 using intra-switching-unit communication circuitry 125. The adjustments are individually addressed to the corresponding switching unit 111, 112.

The adjustments can include:

zero or no adjustments;

adjustments to the timing of the execution of a turn-on command;

adjustments to the timing of the execution of a turn-off command;

adjustments to the timing of the execution of both turn-on command and turn-off command.

The timing adjustments can be expressed either:

relative to receipt of the switching command by the switching unit in each individual switching cycle, or relative to the adjusted timing in a previous (e.g., immediately preceding or otherwise) switching cycle.

In the former case, each timing adjustment will be expressed solely as zero (i.e., no adjustment) or as a positive value that represents a delay in a transition. In the latter case, a timing adjustment may also be a negative value that represents an earlier start to a transition than the start in a previous switching cycle.

In some implementations, the slowest switching unit amongst switching units 110, 111, 112 is designated as a reference switching unit. To balance the current amongst switching units 110, 111, 112, signals with positive values that represent a delay can be sent to the remaining of switching units 110, 111, 112. In the event that the collector-to-emitter voltage VCE of one of the delayed switching units 110, 111, 112 indicates that the desired current setpoint has been overshot, the delay time may be adjusted.

In the implementation described above, the timing of switching transitions of IGBTs 115 in switching units 110, 111, 112 is adjusted on a switching-cycle-by-switching-cycle basis exclusively using VCE sense information collected during a previous switching cycle. This is not necessarily the case. For example, in some implementations, the timing of switching transitions need only be adjusted every N switching-cycles, where N is greater than one, or mathematically: N>1. Thus, switching adjustments can be applied either in a next, immediately subsequent switching cycle or in another subsequent switching cycle. By adjusting timing every N switching cycles, enough time to complete the calculation of delay times and communicate the relevant information to the devices can be provided. As another example, in some implementations, the adjustments to the timing of switching transitions can consider VCE sense information collected during the previous M switching-cycles, where M is greater than one, or mathematically:

M>1. For example, an average or weighted average of VCE sense information can be used. In some instances, both N>1 and M>1.

Also, in the implementation described above, switching controller and driver circuitry 120 in switching unit 110 determines the adjustments that are to be made to the timing of the switching transitions of the IGBT power switches 115 in switching units 110, 111, 112. This is not necessarily the case. Rather, in other implementations, some or all of the determinations can be performed elsewhere. For example, in some implementations, system controller 105 can determine adjustments. As another example, in some implementations, system controller 105 can determine some of the adjustments and switching controller and driver circuitry 120 in switching unit 110 can determine others. For example, switching controller and driver circuitry 120 in switching unit 110 may be responsible for determining the adjustments where current is to be balanced, whereas system controller 105 may be responsible for determining the adjustments where current is to be unbalanced. As yet another example, in some implementations, a human user can specify the adjustments.

Figures 2A, 2B:
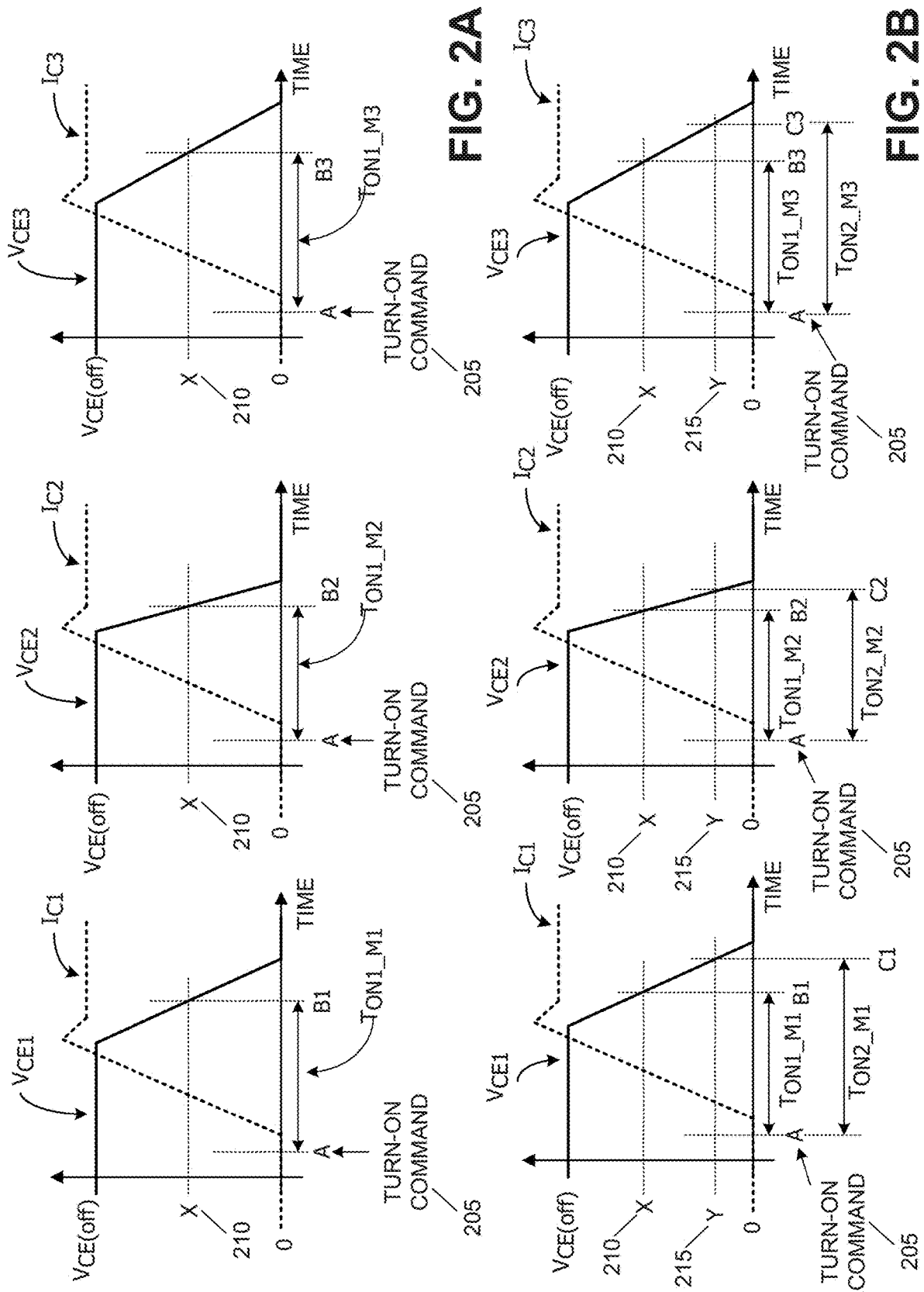
FIGS. 2A-2D schematically illustrate different approaches to determining the current-carrying behavior of IGBTs based on VCE sense information during switching transitions.
Figures 2C, 2D:
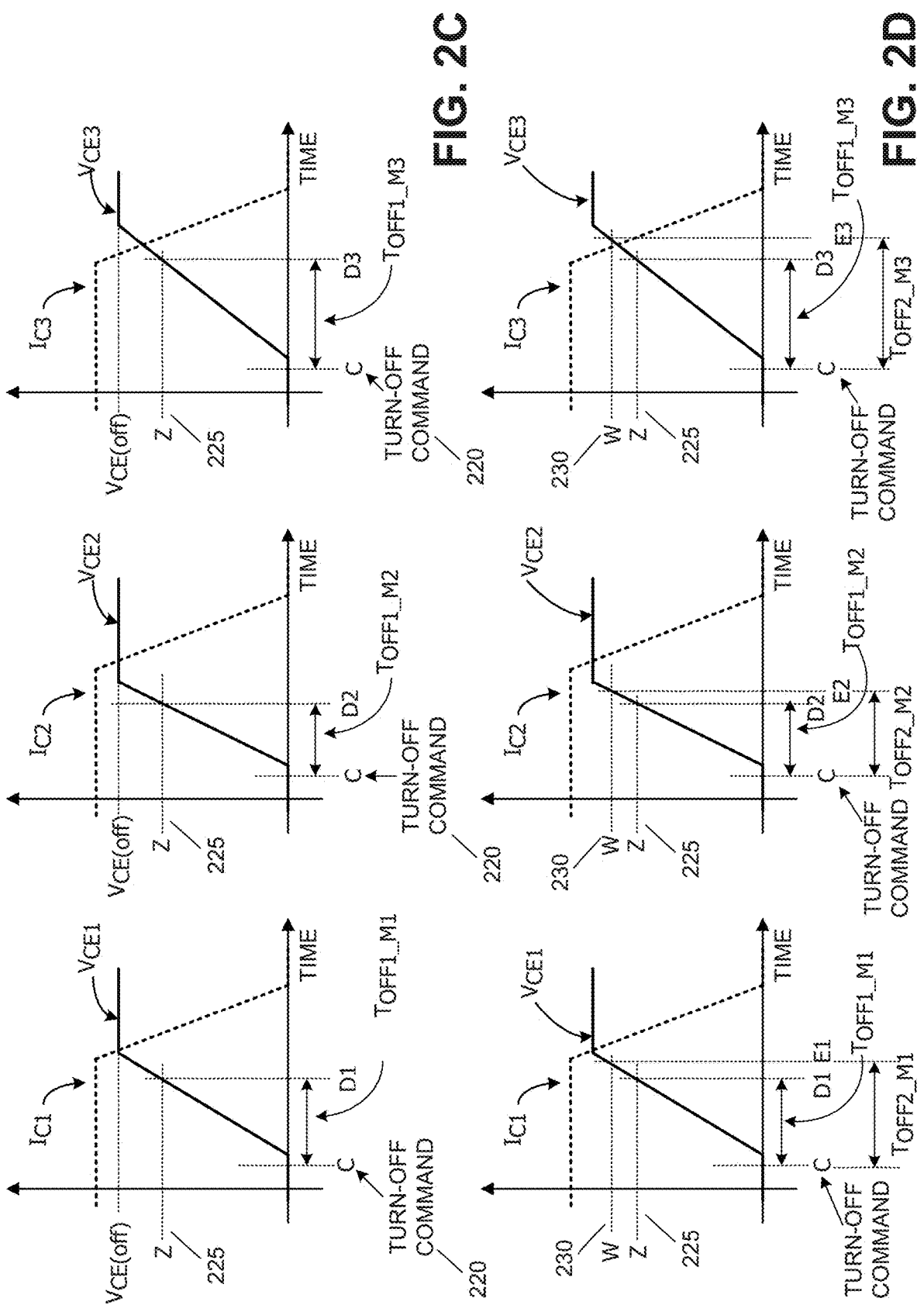

FIGS. 2A-2D schematically illustrate different approaches to determining the current-carrying behavior of IGBTs based on VCE sense information during switching transitions. In particular, FIGS. 2A, 2B schematically illustrate the collector-to-emitter voltages VCE and collector currents IC of three different IGBT switches as a function of time during transitions from an OFF state to an ON state in three different switching units, whereas FIGS. 2C, 2D schematically illustrate the collector-to-emitter voltages VCE and collector currents IC of three different IGBT switched as a function of time during transitions from an ON state to an OFF state.

The OFF/ON transitions illustrated in FIGS. 2A, 2B are triggered by turn-on commands 205 that occurs at time A. In the context of system 100 (FIG. 1), turn-on commands 205 can be received from system controller 105 by master switching unit 110 over communication channel(s) 117. The turn-on commands 205 are relayed from master switching unit 110 to itself and to slave switching units 111, 112 over communication channel(s) 130.

Even though the switching commands are conveyed to switching units 110, 111, 112 over the same communication channel(s) 130, it is understood that differences in propagation delays still exist within system 100. In some implementations, propagation delays are measured during an initialization stage. An example is discussed below. In some implementations of system 100 (FIG. 1), the occurrence of time A in different switching units 110, 111, 112 will be defined and recorded—at least temporarily—at switching controller and driver circuitry 120 within the master switching unit 110. In other implementations, clocks at different switching units 110, 111, 112 are synchronized and the time A at which each turn-on command 205 occurs is assumed to be the same in the different switching units 110, 111, 112.

Driver circuitry in the different switching units responds to turn-on commands 205 by appropriately biasing the gates of the IGBT(s) in those switching units to cause the OFF to ON transition. In response, the respective collector-to-emitter voltages VCE1, VCE2, VCE3 will decrease from the collector-to-emitter voltage during the IGBT off-time VCE (off) to nearly zero. The collector currents IC1, IC2, IC3 will increase from nearly zero to the level of the current conducted by that switch in the ON state (after, in general, overshooting this current level). The decrease in the collector-to-emitter voltages VCE1, VCE2, VCE3 will be reflected in the VCE sense information and information regarding the current-carrying behavior of IGBT switches can be discerned from the VCE sense information.

For example, in FIG. 2A, a voltage threshold level X 210 is defined for all three switches. The times B1, B2, B3 at which the collector-to-emitter voltages VCE1, VCE2, VCE3 fall to or below voltage threshold level X 210 can be measured by each switching unit. In the context of system 100 (FIG. 1), the times B1, B2, B3 will be determined by the switching controller and driver circuitry 120 in switching units 110, 111, 112. Data characterizing times B1, B2, B3 are transmitted to switching controller and driver circuitry 120 within the master switching unit 110 over channel 130.

As an aside, in some implementations, voltage threshold level X 210 (and indeed the other voltage threshold levels described herein) can be tailored to individual switching units 110, 111, 112 and over time. For example, the collector-to-emitter voltages at each switching unit 110, 111, 112 can be measured in the OFF state and the voltage threshold level can be set relative to that OFF state measurement. The measurements and setting can be repeatedly performed by the switching unit 110, 111, 112 to accommodate both the differences between the switching unit 110, 111, 112 and changes to the operational context (e.g., temperature and voltage levels).

Due to variations between the switching units, the times B1, B2, B3 will generally vary from switching unit-to-switching unit. In implementations where clocks in the different switching units 110, 111, 112 are synchronized, the time A at which each turn-on command 205 occurs is substantially common and times B1, B2, B3 embody information regarding current-carrying behavior of the individual IGBT switches. The same information can be embodied in a respective turn-on time TON1_M1, TON1_M2, TON1_M3 for each IGBT, where the turn-on times TON1_M1, TON1_M2, TON1_M3 are the durations between times B1, B2, B3 and time A. The turn-on times TON1_M1, TON1_M2, TON1_M3 are representative of the delay between the power switch being controlled ON and the collector-to-emitter voltages VCE1, VCE2, VCE3 reaching the voltage threshold level X 210.

In the schematic illustration of FIG. 2A, the downward slope of collector-to-emitter voltage VCE2 during the OFF to ON transition is somewhat steeper than the slope of collector-to-emitter voltages VCE1, VCE3 and the slope of VCE3 is somewhat more gradual than the slopes of VCE1, VCE2. The turn-on time TON_M2 is somewhat shorter than turn-on time TON_M1, which in turn is somewhat shorter than turn-on time TON_M3. Times B1, B2, B3 and turn-on times TON1_M1, TON1_M2, TON1_M3 embody information regarding the current-carrying behavior of IGBT switching units during a switching cycle. Further, as discussed above, this information can be used to determine relatively fine adjustments that are to be made to the timing of the switching transitions in the next switching cycle.

Multiple voltage thresholds can also be used to discern current-carrying behavior of the IGBTs from the VCE sense information. For example, in FIG. 2B, an additional voltage threshold level Y 215 is defined for all three switching units. The times C1, C2, C3 at which the collector-to-emitter voltages VCE1, VCE2, VCE3 fall to or below voltage threshold level Y 215 can be determined in each switching unit. In the context of system 100 (FIG. 1), the times C1, C2, C3 will be determined by the switching controller and driver circuitry 120 in switching units 110, 111, 112. Data characterizing times C1, C2, C3 are transmitted to switching controller and driver circuitry 120 within the master switching unit 110 over channel 130.

Like B1, B2, B3, the times C1, C2, C3 will generally vary from switching-unit-to-switching-unit. Again assuming synchronization, the time A at which each turn-on command 205 occurs is common to the switching units and times B1, B2, B3, C1, C2, C3 embody information regarding current-carrying behavior of the individual IGBTs. The same information can be embodied in respective turn-on times TON1_M1 and TON2_M1 for a first switching unit, TON1_M2 and TON2_M2 for a second switching unit, and TON1_M3 and TON2_M3 for a third switching unit, where the turn-on times TON1_M1, TON1_M2, TON1_M3 are the durations between times B1, B2, B3 and time A and TON2_M1, TON2_M2, TON2_M3 are the durations between times C1, C2, C3 and time A. In the context of system 100 (FIG. 1), switching controller and driver circuitry 120 in either master switching unit 110 or in the individual slave switching units 111, 112 can compute turn-on times TON1_M1, TON1_M2, TON1_M3, TON2_M1, TON2_M2, TON2_M3 using times B1, B2, B3, C1, C2, C3 and the time of the occurrence of time A.

Turning to FIGS. 2C, 2D, the ON/OFF transitions illustrated in FIGS. 2C, 2D are triggered by turn-off commands 220 that occur at time C. In the context of system 100 (FIG. 1), turn-on commands 205 can be received from system controller 105 by master switching unit 110 over communication channel(s) 117 and relayed to driver circuitry within switching controller and driver circuitry 120. The turn-off commands 220 can also be received from master switching unit 110 by slave switching units 111, 112 over communication channel(s) 130 and relayed to driver circuitry within switching controller and driver circuitry 120. Assuming clock synchronization, the time C at which each turn-off command 220 occurs is the same in the different switching units regardless of the path of turn-off command 220 to the driver circuitry within those switching units. In other implementations of system 100 (FIG. 1), the occurrence of time C will be defined and recorded—at least temporarily—at switching controller and driver circuitry 120 within the master switching unit 110.

Driver circuitry in the different switching units responds to turn-off commands 220 by appropriately biasing the gates of the IGBT(s) in those switching units to cause the ON/OFF transition. In response, the respective collector-to-emitter voltages VCE1, VCE2, VCE3 will increase from nearly zero to the voltage VCE(off). The collector currents IC1, IC2, IC3 will decrease from the level of the current conducted by that switching unit in the ON state to nearly zero (i.e., only leakage currents). The increase in the collector-to-emitter voltages VCE1, VCE2, VCE3 will be reflected in the VCE sense information and information regarding the current-carrying behavior of the IGBTs can be discerned from the VCE sense information.

For example, in FIG. 2C, a voltage threshold level Z 225 is defined for all three switching units. The times D1, D2, D3 at which the collector-to-emitter voltages VCE1, VCE2, VCE3 rise to or above voltage threshold level Z 225 can be determined in each switching unit. In the context of system 100 (FIG. 1), the times D1, D2, D3 will be determined by the switching controller and driver circuitry 120 in switching units 110, 111, 112. Data characterizing times D1, D2, D3 are transmitted to switching controller and driver circuitry 120 within the master switching unit 110 over channel 130.

Due to, e.g., variations between the IGBTs and the path of turn-off command 205 to the driver circuitry within those switching units, the times D1, D2, D3 will generally vary from switching unit-to-switching unit. Assuming clock synchronization, the time C at which each turn-off command 220 occurs is common to the switching units and times D1, D2, D3 embody information regarding current-carrying behavior of the individual IGBTs. The same information can be embodied in a respective turn-off time TOFF1_M1, TOFF1_M2, TOFF1_M3 for each IGBT, where the turn-off times TOFF1_M1, TOFF1_M2, TOFF1_M3 are the durations between times D1, D2, D3 and time C. The turn-off times TOFF1_M1, TOFF1_M2, TOFF1_M3 are representative of the delay between the power switch being controlled OFF and when the collector-to-emitter voltage VCE1, VCE2, and VCE3 reaching the voltage threshold level Z 225. In some implementations of system 100 (FIG. 1), switching controller and driver circuitry 120 in master switching unit 110 can compute turn-off times TOFF1_M1, TOFF1_M2, TOFF1_M3 using times D1, D2, D3 and the time of occurrence of time C.

In the schematic illustration of FIG. 2C, the upward slope of collector-to-emitter voltage VCE2 during the ON to OFF transition is somewhat steeper than the slope of collector-to-emitter voltages VCE1, VCE3 and the slope of VCE3 is somewhat more gradual than the slopes of VCE1, VCE2. The turn-off time TOFF1_M2 is somewhat shorter than turn-off time TOFF1_M1, which in turn is somewhat shorter than turn-off time TOFF1_M3. Times D1, D2, D3 and turn-off times TOFF1_M1, TOFF1_M2, TOFF1_M3 embody information regarding the current-carrying behavior of the IGBTs during a switching cycle. Further, as discussed above, this information can be used to determine relatively fine adjustments that are to be made to the timing of the switching transitions in the next switching cycle.

Multiple voltage thresholds can also be used to discern the current-carrying behavior of IGBTs from the VCE sense information. For example, in FIG. 2D, an additional voltage threshold level W 230 is defined for all three switching units. The times E1, E2, E3 at which the collector-to-emitter voltages VCE1, VCE2, VCE3 rise to or above voltage threshold level W 230 can be determined in each switching unit. In the context of system 100 (FIG. 1), the times E1, E2, E3 will be determined by the switching controller and driver circuitry 120 in switching units 110, 111, 112. Data characterizing times E1, E2, E3 are transmitted to switching controller and driver circuitry 120 within the master switching unit 110 over channel 130.

Like D1, D2, D3, the times E1, E2, E3 will generally vary from switching unit-to-switching unit. Assuming clock synchronization, the time C at which each turn-off command 220 occurs is common to the switching units and times D1, D2, D3, E1, E2, E3 embody information regarding current-carrying behavior of the individual IGBTs. The same information can be embodied in respective turn-off times TOFF1_M1 and TOFF2_M1 for a first switching unit, TOFF1_M2 and TOFF2_M2 for a second switching unit, and TOFF1_M3 and TOFF2_M3 for a third switching unit, where the turn-off times TOFF1_M1, TOFF1_M2, TOFF1_M3 are the durations between times D1, D2, D3 and time C and TOFF2_M1, TOFF2_M2, TOFF2_M3 are the durations between times E1, E2, E3 and time C. In some implementations of system 100 (FIG. 1), switching controller and driver circuitry 120 in either master switching unit 110 or slave switching units 111, 112 can compute turn-off times TOFF1_M1, TOFF1_M2, TOFF1_M3, TOFF2_M1, TOFF2_M2, TOFF2_M3 using times D1, D2, D3, E1, E2, E3 and the time of the occurrence of time C.

Although FIGS. 2A-2D are cast exclusively in terms of the times needed for the collector-to-emitter voltage VCE to fall or rise to one or more threshold voltage levels, in other implementations, the value of the collector-to-emitter voltage VCE at one or more defined times can be used to determine the current-carrying behavior of IGBTs based on VCE sense information during switching transitions. For example, the collector-to-emitter voltage VCE in the different IGBTs can be measured after the passage of one or more times that are defined relative to turn-on commands 205 or turn-off commands 220. The increase in or decrease of the collector-to-emitter voltages VCE1, VCE2, VCE3 will be reflected in these voltage measurements and information regarding the current-carrying behavior of the individual IGBTs can be discerned.

Figure 3:
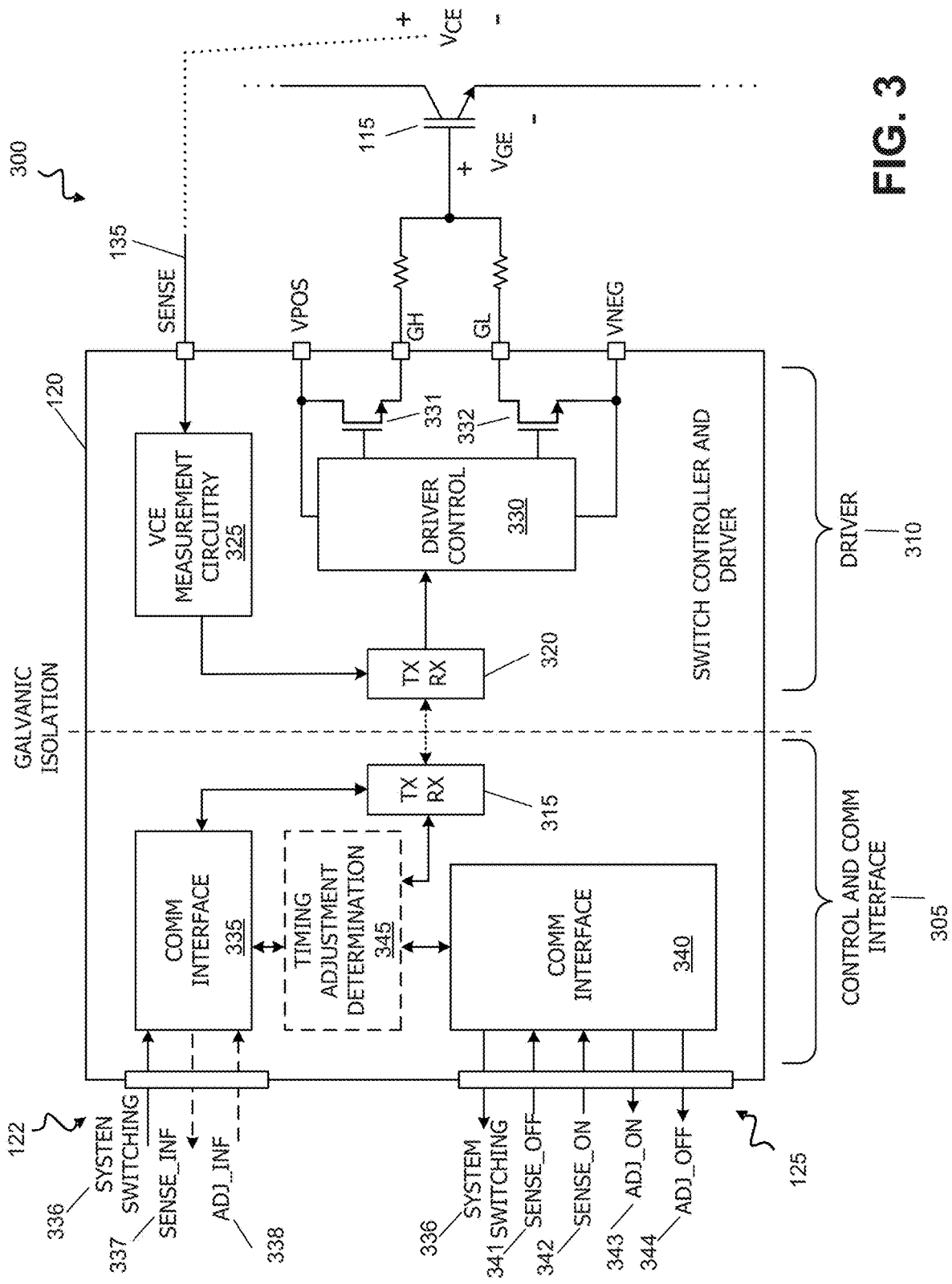
FIG. 3 is a schematic representation of an implementation of a power switch and associated circuitry.

FIG. 3 is a schematic representation of an implementation of a switching unit 300. Switching unit 300 can be part of a system in which switching of the different power switches is coordinated, such as switching units 110, 111, 112 in system 100 (FIG. 1). For the sake of brevity, switching unit 300 as described acts as a master switching unit that interfaces with a system controller and coordinates the switching of any slave switching units.

Switching unit 300 includes one or more IGBT power switches 115 and switching controller and driver circuitry 120. Switching controller and driver circuitry 120 includes extra-switching-unit communication circuitry 122 and intra-switching-unit communication circuitry 125 that can communicate with a system controller and slave switching units over channels 117, 130.

In the illustrated implementation of switching unit 300, a control and communications interface circuitry portion 305 is galvanically isolated from a driver circuitry portion 310. Portions 305, 310 communicate across the galvanic barrier using respective transceivers 315, 320. Transceivers 315, 320 can be implemented to communicate using, e.g., optical couplers, transformers, coupled lead frames, capacitors, as well as the associated switching circuitry. Once again, bidirectional communications can be implemented using either a bidirectional channel and/or multiple unidirectional channels.

In addition to transceiver 320, driver circuitry portion 310 also includes VCE measurement circuitry 325, switch driver control circuitry 330, a pull-up transistor 331, and a pull-down transistor 332.

VCE measurement circuitry 325 is coupled to VCE sense line 135 and configured to measure either the time required for the collector-to-emitter voltage VCE to reach a threshold or the level of collector-to-emitter voltage VCE after a defined time. Time measurements can be implemented using, e.g., voltage or current comparators and voltage or current level measurements can be implemented using, e.g., timer circuitry and an analog-to-digital converter that samples the collector-to-emitter voltage VCE or corresponding current across the SENSE line 135 in response to a triggered from the timer circuitry. Regardless of the implementation details, VCE measurement circuitry 325 is configured to convey the information characterizing the measured time or voltage level to transceiver 320, typically on a switching-cycle-by-switching cycle basis.

As an aside, additional control functionality (e.g., over-current protection, overvoltage protection) will generally be implemented using the information on VCE sense line 135.

Switch driver control circuitry 330 is configured to control the driving of IGBT power switch 115 by switching pull-up and pull-down transistors 331, 332 into and out of conduction. In the illustrated implementation, this will alternatively couple a voltage that is positive with respect to the emitter voltage of IGBT power switch 115 (i.e., VPOS) to a high output terminal GH and gate resistor that in turn couple to the gate of IGBT power switch 115, and a voltage that is negative with respect to the emitter voltage of IGBT power switch 115 (i.e., VPNEG) to a low output terminal GL and gate resistor that in turn couple to the gate of IGBT power switch 115.

Other implementations are possible. For example, in some implementations, pull-down transistor 332 couples the emitter of IGBT power switch 115 to the gate of IGBT power switch 115. As another example, in some implementations, a single output terminal and gate resistor are used. In a further example, a current source gate driver output stage is used. As another example, in some implementations, timing adjustments are implemented by the driver controller.

Control and communications interface circuitry portion 305 includes both extra-switching-unit communication circuitry 122 and intra-switching-unit communication circuitry 125, as well as transceiver 315.

Extra-switching-unit communication circuitry 122 includes a communications interface 335 that can communicate with components other than switching-units using one or more communication protocols. For example, amongst the information that communications interface 335 can receive are system switching commands 336. System switching commands 336 indicate the desired state of all the IGBT switches 115 in a system like system 100 (FIG. 1).

Intra-switching-unit communication circuitry 125 includes a communications interface 340 that can communicate with other switching units using one or more communication protocols. For example, in some implementations, system switching commands 336 that are received at communications interface 335 are simply relayed to other switching units via communications interface 340. In some implementations, the system switching commands 336 that are sent to other switching units are frequency-encoded. For example, a relatively high frequency ac clock signal can indicate that that all of the switching units are to be in an ON state, whereas an ac clock signal with a distinguishable frequency (e.g., ⅟₁₀th to ½ or 2 to 10 times the frequency indicating that the all of the switching units are to be in the ON state) can indicate that that all of the switching units are to be in an OFF state. Such an encoding is robust in the context of power switching. In particular, even if the transition of system switching commands 336 between the frequencies is obscured by noise, a signal that can be interpreted by communications interface 335 will soon be decoded and communications interface 335 will respond accordingly.

As another example of communications between communications interface 340 and other switching units, as discussed in more detail below, a frame-based communication protocol can be used to receive signals 341, 342 that characterize the collector-to-emitter voltage VCE of other power switches during switching transitions and to transmit signals 343, 344 that characterize the relatively fine adjustments that are to be made to the timing of switching transitions in other power switches in a system. In particular, SENSE_OFF signals 341 characterize the collector-to-emitter voltage VCE of other power switches during transitions from an ON state to an OFF state, SENSE_ON signals 342 characterize the collector-to-emitter voltage VCE of other power switches during transitions from an OFF state to an ON state, ADJ_ON signals 343 characterize the adjustments that are to be made to the timing of switching transitions into an ON state, and ADJ_OFF signals 344 characterize the adjustments that are to be made to the timing of switching transitions into an OFF state.

In some implementations, the timing adjustments that are characterized in signals 343, 344 and transmitted to slave switching units can be cast in terms of a number of cycles of the clock signals that encode system switching commands 336. For example, suppose that system switching command 336 encodes the ON state using a 100 MHz clock signal. The rising and falling edges of the clock signal occurs every 5 nanoseconds. Signals 343, 344 can cast a timing adjustment of 20 nanoseconds as four transitions/two clock cycles.

The relatively fine adjustments that are to be made to the timing of switching transitions in switching unit 300 and/or other switching units in a system can be determined either by switching unit 300 itself, by external circuitry (e.g., system controller 105 (FIG. 1), or by both switching unit 300 and external circuitry.

In implementations in which external circuitry participates in the determination of fine adjustments, communications interface 335 can also convey, to external components, sense information signals 337 that characterize the sensed collector-to-emitter voltage VCE of other power switches during switching transitions. Communications interface 335 can also receive, from external components, adjustment information signals 338 that characterize the relatively fine adjustments that are to be made to the timing of switching transitions in other switching units. Thus, sense information signals 337 can include at least some of the information content of SENSE_ON signals 342 and SENSE_OFF signals 341, as well as comparable information that characterizes the collector-to-emitter voltage VCE of the IGBT in switching unit 300 during its transitions. Also, adjustment information signals 338 can include at least some of the information content of ADJ_ON signals 343 and ADJ_OFF signals 344, as well as comparable information that characterizes the relatively fine adjustments that are to be made to the timing of switching transitions in switching unit 300.

In implementations in which switching unit 300 participates in the determination of fine adjustments, switching unit 300 includes timing adjustment determination circuitry 345. Timing adjustment determination circuitry 345 is circuitry that is configured to determine relatively fine adjustments that are to be made to the timing of switching transitions in the switching units of a system, including as appropriate switching unit 300. For example, timing adjustment determination circuitry 345 can be implemented using a digital clock within the ASIC and may be configured by registers.

Regardless of whether the timing adjustments are determined by timing adjustment determination circuitry 345 or external circuitry, the timing adjustments can be designed to achieve a desired current distribution in the power switches of a system.

In some implementations, the adjustments are designed to approach a desired current distribution gradually over multiple switching cycles. By way of example, Tables 1-3 illustrate example sets of timing adjustments that are designed to achieve balanced current sharing by ensuring that the times when the collector-to-emitter voltage VCE in six different power switches cross a single voltage threshold level during transitions into an ON state are approximately the same. Comparable timing adjustments can be made to transitions into an OFF state. Also, comparable timing adjustments can be designed to achieve balanced current sharing by ensuring that the collector-to-emitter voltages VCE at certain times after a transition has started are approximately the same. In other implementations, multiple voltage threshold levels or multiple times after a transition can be used.

Table 1 illustrates example data for a first switching cycle. The first switching cycle can be a first cycle after start-up, after a system reset, or the like. In this implementation, there are no predefined timing adjustments for the first switching cycle and the accumulated adjustments for all switching units is initially zero. This is not necessarily the case and, in some implementations, even a first cycle after start-up or a system reset can have a predefined adjustment.

In any case, examples of sensed times when the collector-to-emitter voltage VCE crosses a voltage threshold level are set forth in the column labeled "crossing time." In some implementations, the crossing times can be measured relative to the time when the system switching command 336 is received by switching units 110, 111, 112 over channel 130. In the context of FIGS. 2A and 2B, the crossing times would be measured from index A 205. In the context of FIGS. 2C and 2D, the crossing times would be measured from index C 220. In other implementations, the crossing times can be measured relative to the time when the system switching command 336 received by the master switching unit from the system controller indicates that a transition is to occur.

In Table 1, the units of time are arbitrary, but in some implementations can be in nanoseconds. As shown, there is some variation in the times when the collector-to-emitter voltages VCE in the different switching units cross the voltage threshold level. For example, although the average crossing time is approximately 104 time units, the first slave switching unit crosses the voltage threshold level earlier and the third slave switching unit crosses the voltage threshold level later. More current will be conducted by the first slave switching unit than the third and the current distribution may be relatively unbalanced.

As for the timing adjustments themselves, the slowest power switch is in the third slave switching unit. The third slave switching unit can act as a reference switching unit and the adjustments for the other switching units can be designed to ensure that the collector-to-emitter voltages VCE of the switches in those other switching units cross the voltage threshold level at the same time as the reference. Further, although the adjustments for the other switching units are designed to distribute the current more uniformly, the adjustments are determined with the understanding that the desired current distribution may only be achieved gradually over multiple switching cycles. For example, the timing adjustment for the first slave switching unit is 10 units, although the power switch of the first slave switching unit crossed the voltage threshold level 30 units earlier than the power switch of the third slave switching unit.

A gradual, multi-cycle approach to the desired current distribution can be achieved in a variety of different ways. For example, in some implementations, the magnitude of permissible adjustments may be limited in range. In such cases, even if the magnitude of the differences between switching units is large, multiple switching cycles will be needed to approach to the desired current distribution. As another example, the magnitude of the adjustments may be limited to some fraction of the magnitude of the differences between switching units. As yet another example, a combination of these and other techniques can be used. In any case, the direction of adjustment is designed to achieve a desired current distribution, i.e., to make the current distribution more uniform when current sharing is to be balanced or achieve a desired uneven distribution when current sharing is to be unbalanced.

TABLE 1

| FIRST SWITCHING CYCLE | | | |
| --- | --- | --- | --- |
| SWITCHING UNIT | ACCUMULATED ADJUSTMENT | CROSSING TIME | TIMING ADJUSTMENT |
| Master | 0 | 100 | 10 |
| Slave 1 | 0 | 90 | 10 |
| Slave 2 | 0 | 105 | 10 |
| Slave 3 | 0 | 120 | 0 |
| Slave 4 | 0 | 110 | 10 |
| Slave 5 | 0 | 100 | 10 |

Table 2 illustrates example data for a second switching cycle. In this illustrative example, the second switching cycle immediately follows the first, i.e., the timing adjustments are applied on a switching cycle-by-switching cycle basis. This is not necessarily the case. For example, in other implementations, timing adjustments can be made after multiple cycles have passed or timing adjustments can be made only when a threshold level of discrepancy between the crossing times is present.

Returning to Table 2, the accumulated adjustments for all switching units are those set after the first switching cycle. After those adjustments are applied, the times when the collector-to-emitter voltage VCE crosses a voltage threshold level are sensed. As shown, there is not a one-to-one correspondence between the implemented timing adjustment and the change in crossing time. For example, the timing adjustment for the master switching unit after the first switching cycle was 10 units. However, the change in crossing time was only five units (i.e., the crossing time went from 100 units to 105 units). Such discrepancies may arise for a number of different reasons. For example, there may be noise on VCE sense line 135 (FIG. 1). The relevant devices may have different temperature/voltage/current dependent tolerances. The resolution of the measurements and the adjustments may differ. Also, some portion of the crossing time may be attributable to factors that bear a one-to-one correspondence to the time when the switching transition is started and other portions may be attributable to factors that do not bear a one-to-one correspondence. For example, the transmission delay for a switching unit that is relatively far from the master switching unit may be compensated on a one-to-one basis by delaying the transitions of switching units that are relatively closer to the master switching unit. On the other hand, differences in the slope or the shape of the collector-to-emitter voltage VCE in different switching units may not be compensated on a one-to-one basis. In any case, the change in crossing time for a given switching unit may be larger than the timing adjustment (as in the second and fourth slave switching unit) or smaller than the timing adjustment (as in the master switching unit, first slave switching unit, and fifth slave switching unit).

As for the timing adjustments themselves, the third slave switching unit remains the reference switching unit. However, the crossing time of the third slave switching unit has become sooner and both the second and the fourth slave switching units crossed the voltage threshold level after the third slave switching unit. There may be several reasons for the earlier crossing time of the third slave switching unit including, e.g., temperature changes or noise that impaired the third slave switching unit's receipt of the system switching command.

In any case, new adjustments are determined, still referenced to the third slave switching unit. Both the second and the fourth slave switching units have negative timing adjustments, whereas the master and the first slave switching units have positive timing adjustments. The collector-to-emitter voltage VCE of the power switch of the fifth slave switching unit crossed the voltage threshold at the same time as the collector-to-emitter voltage VCE of the power switch of the reference third slave switching unit and no adjustments are applied.

TABLE 2

| SECOND SWITCHING CYCLE | | | |
| --- | --- | --- | --- |
| SWITCHING UNIT | ACCUMULATED ADJUSTMENT | CROSSING TIME | TIMING ADJUSTMENT |
| Master | 10 | 105 | 10 |
| Slave 1 | 10 | 95 | 10 |
| Slave 2 | 10 | 120 | −5 |
| Slave 3 | 0 | 115 | 0 |
| Slave 4 | 10 | 125 | −10 |
| Slave 5 | 10 | 115 | 0 |

Table 3 illustrates example data for a third switching cycle. The accumulated adjustments for all switching units are those set after the second switching cycle. After those adjustments are applied, the times when the collector-to-emitter voltages $V_{CE}$ cross a voltage threshold level are sensed. As shown, the times when the collector-to-emitter voltages VCE crosses the voltage threshold level are nearly identical, with only the crossing time of the fourth slave switching unit deviating from the reference. Timing adjustments for the next switching cycle can also be determined.

TABLE 3

| THIRD SWITCHING CYCLE | | | |
| --- | --- | --- | --- |
| SWITCHING UNIT | ACCUMULATED ADJUSTMENT | CROSSING TIME | TIMING ADJUSTMENT |
| Master | 20 | 120 | 0 |
| Slave 1 | 20 | 120 | 0 |
| Slave 2 | 5 | 120 | 0 |
| Slave 3 | 0 | 120 | 0 |
| Slave 4 | 0 | 115 | 5 |
| Slave 5 | 10 | 120 | 0 |

Figure 4:
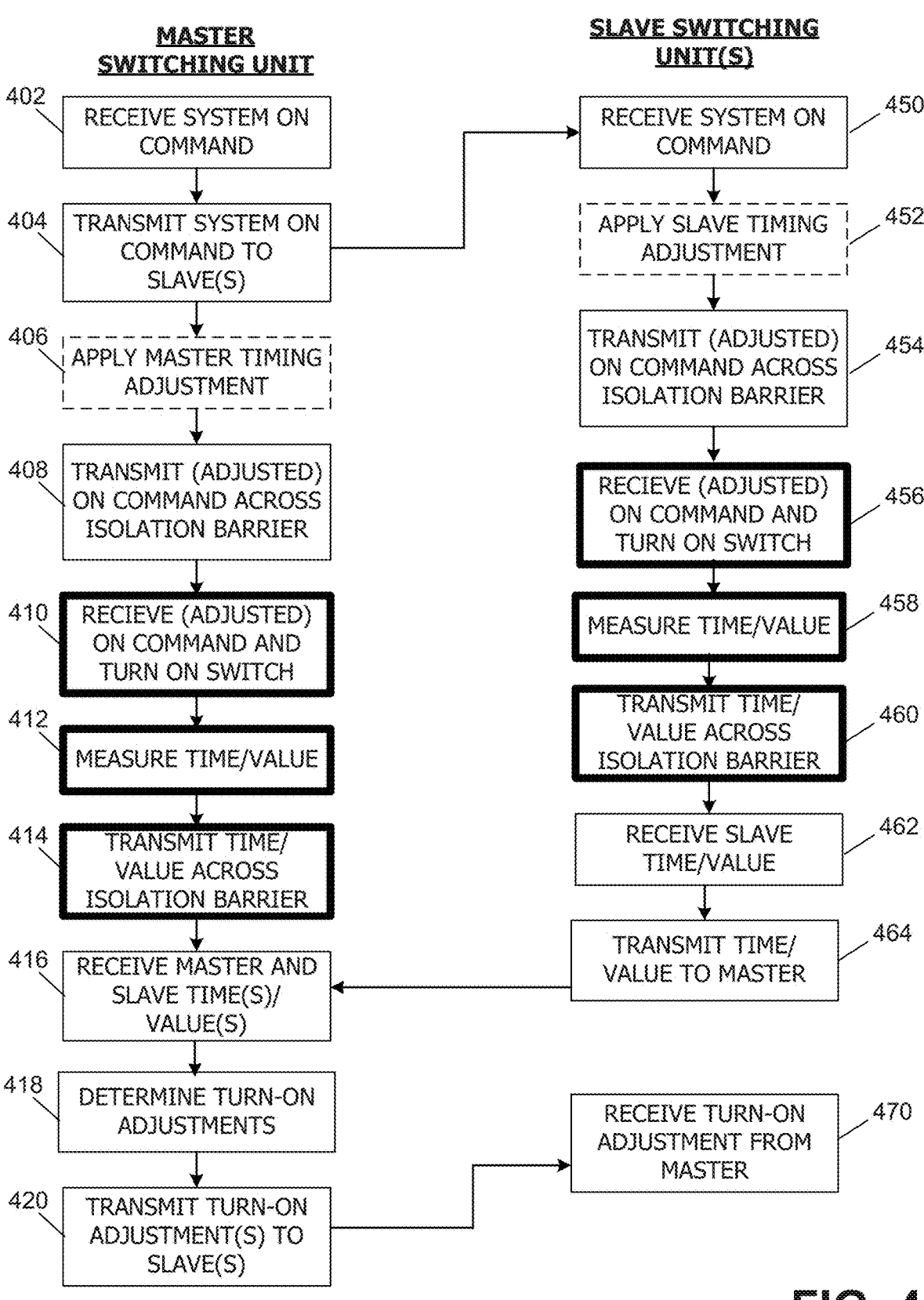
FIG. 4 is a swim lane diagram that represents operations in a system in which switching of the different power switches is coordinated.

FIG. 4 is a swim lane diagram that represents operations in a system in which switching of the different power switches is coordinated. The left lane represents operations that are performed by a master switching unit in such a system. For example, the operations in the left lane can be performed by switching units 110, 300 (FIGS. 1, 3). The right lane represents operations that are performed by a slave switching unit in such a system. For example, the operations in the right lane can be performed by switching units 111, 112 (FIG. 1). Further, operations performed on the primary side of the switching units are bounded by relatively thin lines and operations performed on the secondary side of the switching units are bounded by relatively thick lines.

For purposes of illustration, it is assumed that all turn on adjustments are determined by the master switching unit. However, as discussed above, this is not necessarily the case. Also, ongoing operations rather than, e.g., operations immediately after start-up or a reset are represented. In the context of the timing adjustments discussed in Tables 1-3, the operations in FIG. 4 can represent the second (Table 2) or any subsequent switching cycles.

At 402, the master switching unit receives a system ON command. A system ON command is a type of a system switching command that indicates that the IGBT switches in the system are to be in an ON state.

At 404, the master switching unit transmits the system ON command to one or more slave switching unit in the system. The system ON command is also looped back to the master switching unit. In one example, the loop back may compensate for propagation delays to the one or more slave switching units.

Further, the master switching unit applies its own timing adjustments (e.g., the accumulated timing adjustments in Tables 2, 3) to the system ON command. In the illustrated implementation, the timing adjustments for the master switching unit are applied at 406 on the primary side of the master switching unit and an adjusted ON command is transmitted at 408 across a galvanic isolation barrier to the secondary side of the master switching unit. In other implementations, an unadjusted ON command is transmitted across a galvanic isolation barrier and the timing adjustments for the master switching unit are applied at secondary side. To ensure that this option is recognized, the application of the timing adjustments for the master switching unit are bounded by dashed relatively thin lines and the transmitted ON command is denoted as an "adjusted ON command."

Continuing with the master switching unit, at 410, the secondary side of the master switching unit receives the adjusted ON command and turns on the switch in accordance with the adjusted ON command-regardless of where the adjustments are applied. At 412, the relevant of a time needed for the collector-to-emitter voltage VCE to fall to a threshold voltage level or a value of the collector-to-emitter voltage VCE at a defined time is measured. At 414, the measured time or value is transmitted across the isolation barrier from the secondary side to the primary side of the master switching unit.

At 416, the primary side of the master switching unit receives both the measured time or value from its own secondary side as well as one or more measured times or values from the slave(s) in the system.

At 418, the master switching unit determines any new adjustments that are to be applied to the ON command and transmits, at 420, those new adjustments to the slave(s) in the system. In implementations where the adjustments are applied at the secondary, any new adjustment for the master switching unit must be transmitted to the secondary side.

Turning to the slave(s), at 450, a slave switching unit receives the system ON command that was transmitted by the master switching unit.

In the illustrated implementation, the timing adjustments for the slave switching unit are applied at 452 on the primary side of the slave switching unit and an adjusted ON command is transmitted at 454 across a galvanic isolation barrier to the secondary side of the master switching unit. As with the master switching unit, this is not necessarily the case.

At 456, the secondary side of the slave switching unit receives the adjusted ON command and turns on the switch in accordance with the adjusted ON command-regardless of where the adjustments are applied. At 458, the relevant of a time needed for the collector-to-emitter voltage VCE to fall to a threshold voltage level or a value of the collector-to-emitter voltage VCE at a defined time is measured. At 460, the measured time or value is transmitted across the isolation barrier from the secondary side to the primary side of the slave switching unit.

At 462, the primary side of the slave switching unit receives the measured time or value from the secondary side. At 464, the slave switching unit transmits the measured time or value to the master switching unit.

At 470, the slave switching unit receives the new adjustments that are to be applied to the ON command from the master switching unit.

Figure 5:
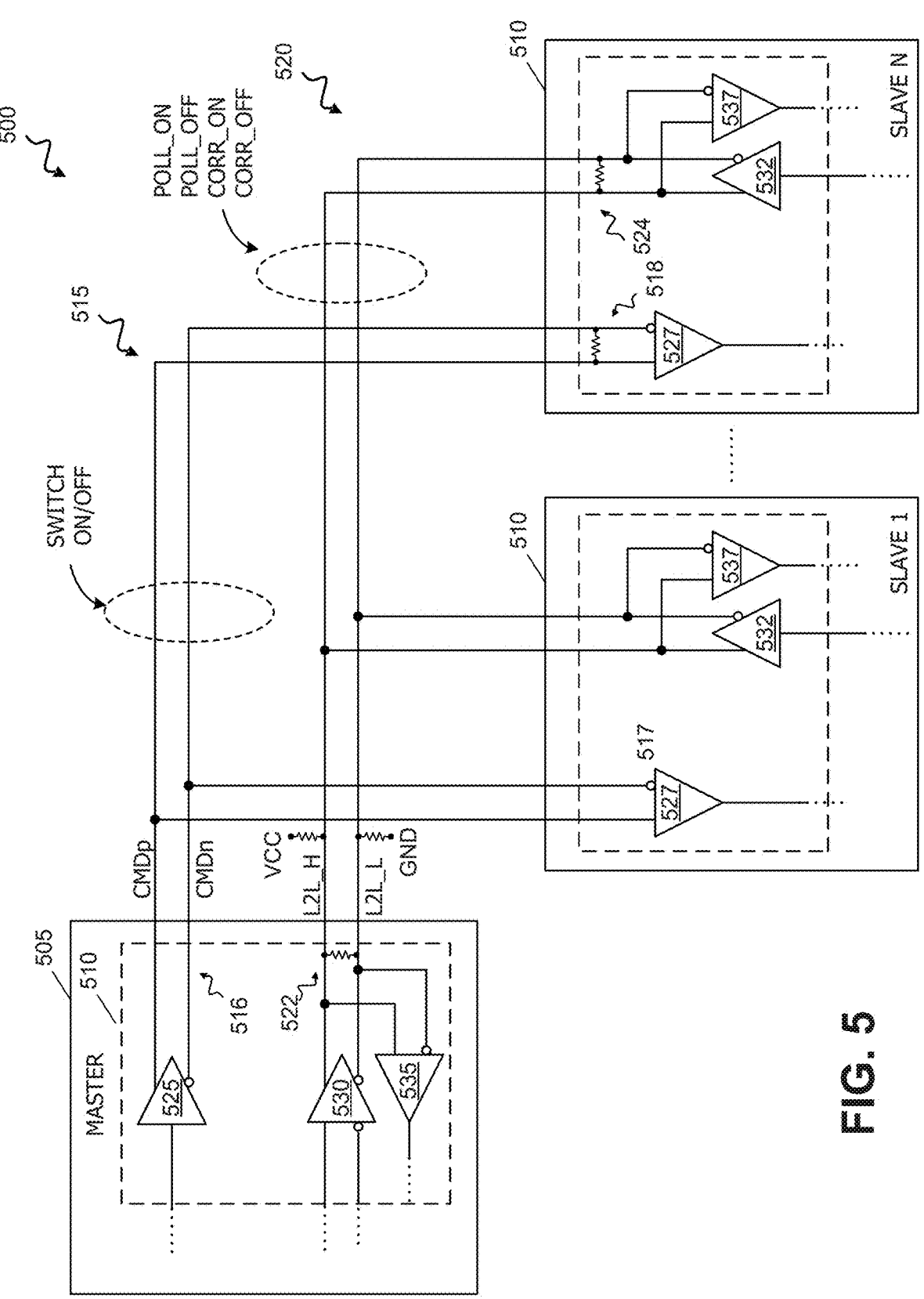
FIG. 5 is a schematic representation of the structure of a bus that can be used to implement communication channels between a master driver and one or more slave drivers in a system in which switching of the different power switches is coordinated.

FIG. 5 is a schematic representation of the structure of a bus 500 that can be used to implement communication channels between a master switching unit 505 and one or more slave switching units 510 in a system in which switching of the different power switches is coordinated. For example, bus structure 500 can be used to implement communication channels 130 (FIG. 1).

The illustrated implementation of bus structure 500 includes a pair of system command lines 515 and a pair of data communication lines 520. System command lines 515 provide a channel for the communication of system commands. System command lines 515 are implemented as differential transmission lines and terminated by termination resistance 518. Termination resistance 518 can include the inherent resistance of components in a switching unit 510 (e.g., the input impedance of receiver(s) in the slave switching unit 510) as well as either fixed or variable resistances that are coupled with the component resistances to define the termination resistance 518 that is "seen" by signals that propagate on system command lines 515. In some implementations, termination resistance is a variable termination resistance and programmable based on the wave impedance of the cable used in system command lines 515.

At least master switching unit 505 includes a differential transmitter 525 that is coupled to system command lines 515 and slave switching unit (s) 510 each include a differential receiver 527 that is coupled to system command lines 515.

Communication lines 520 provide time-divided channels for the communication of data and commands. The data that is communicated can include times or values derived from the collector-to-emitter voltage VCE of the slave switching units during switching transitions and signals that characterize the relatively fine adjustments that are to be made to the timing of switching transitions. The commands that are communicated can include initialization and reset commands, commands indicating that the collector-to-emitter voltage VCE of the slaves is to be sensed and times or values derived therefrom are to be transmitted on communication lines 520, and commands setting the values of the termination resistance 518—as well as the values of termination resistances 522, 524 that terminate communication lines 520.

Master switching unit 505 includes a differential transmitter 530 and receiver 535 that are coupled to communication lines 520. Slave switching unit(s) 510 each include a differential receiver 532 and receiver 537 that are coupled to system command lines 520.

As discussed above, the number of slave switching units 510 in a system in which switching of the different power switches is coordinated can vary. Further, in some applications, it would be desirable to make relatively fine adjustments to the timing of switching transitions in individual switches on a switching cycle-by-switching cycle basis.

In operation, bus 500 can implement high frequency communication channels between a master switching unit 505 and a variable number of slave switching units 510 to coordinate switching. For example, master switching unit 505 can receive a command from a system controller indicating that switching is to be coordinated, e.g., to achieve a desired balanced or unbalanced current sharing. In response, master switching unit 505 can broadcast a command on data communication lines 520 commanding that any slave switching units 510 on data communication lines 520 reset and respond with a signal identifying that they are present. Arbitration amongst the slaves is not essential at this point, but can be implemented either here or during subsequent exchanges.

After receiving a confirmation that at least one slave switching unit 510 is present, master switching unit 505 can broadcast an initialization command on communication lines 520. Slave switching units 510 that are on communication lines 520 can respond to the initialization command with identifying information. For example, in some implementations, any slave switching units 510 that are present can arbitrate for time slots on communication lines 520 and respond with their respective MAC addresses. If needed, slave switching units 510 can be assigned a short-form address and informed thereof.

Once slave switching units 510 are identified, a frame-based communication protocol can be used to address the individual slave switching units 510. Each frame can include, e.g., the address of the addressed slave switching unit 510, an identification of the command that is being transmitted in that frame, and the data that is relevant to that command. Start sequences, error detection and correction sequences (e.g., a cyclic redundancy check block), information describing the size of the frame, and other information can also be included, as desired.

Amongst the commands that can be sent from master switching unit 505 are commands that the slave switching units 510 are to begin transmitting signals that characterize the collector-to-emitter voltage VCE during switching transitions (e.g., SENSE_OFF signals 341 and SENSE_ON signals 342 (FIG. 3)), and commands that the certain timing adjustments be applied. For example, timing adjustment commands can include data that characterizes the magnitude of those timing adjustments.

Further, the commands that can be sent from master switching unit 505 include commands that set the values of termination resistances 518, 522, 524. In some implementations, the commands that set the values of termination resistances 518, 522, 524 are based upon user-input information about the system. For example, users may be able to input information regarding the impedance of cable(s) that implement lines 515, 520. In some cases, measurements made on lines 515, 520 can also be used to set the values of termination resistances-alone or in conjunction with user input.

In some implementations, the measurements that are performed on lines 515, 520 can include determining which of slave switching units 510 is furthest—in terms of propagation delay—from master switching unit 505. After the furthest switching unit 510 is identified, it can be commanded to set its termination resistances to reduce or eliminate signal reflection and distortion.

In some implementations, a baseline of reflections can first be measured. For example, one or both of differential transmitters 525, 530 in master switching unit 505 can transmit measurement signal(s). One or both of receiver 535 and a receiver on system command lines 515 (not shown) in master switching unit 505 can be measure the reflections that occur from each impedance mismatch along lines 515, 520. This comparison of the transmitted and reflected signals provides a baseline measurement that indicates the impedance mismatches in the absence of any adjustments to the termination resistances 518, 522, 524.

Either before or after the baseline is measured, each of the slave switching units 510 on lines 515, 520 can be addressed, individually and in turn, with commands that set values of termination resistances 518, 522, 524. The impact of those settings on the same reflected signals can be used to attribute reflections to the respective slave switching units 510.

In some implementations, master switching unit 505 can command each of the respective slave switching units 510 to short-circuit and open-circuit the switching unit's connection to lines 515, 520. With the connection short- or open-circuited, master switching unit 505 can measure the reflections along lines 515, 520 and attribute those reflections to the respective slave switching units 510. The reflections that occur latest in time will be attributed to the slave switching unit 510 that is furthest from master switching unit 505. For the sake of illustration, the slave switching unit 510 that is to the right in the schematic illustration of FIG. 5 (i.e., the slave switching unit 10 that includes termination resistances 518, 524) will be assumed to be the slave switching unit 510 that is furthest from master switching unit 505.

After the slave switching unit 510 that is furthest from master switching unit 505 is identified, commands that set the values of termination resistances 518, 524 can be sent to that slave switching unit 510. In some implementations, the appropriate value of termination resistances 518, 524 can be determined using an empirical process in which the master switching unit 505 makes multiple transmissions and measures multiple reflections. For example, a range of impedances can be scanned or impedance can be adjusted gradually until only acceptable reflections are present.

In some implementations, termination resistances 518, 524 can only be set to preassigned termination values. For example, termination values that encompass common cable wave impedances (e.g., 50 Ohms, 75 Ohms, 100 Ohms, 125 Ohms, and 150 Ohms) can be preassigned.

A number of implementations have been described. Nevertheless, it will be understood that various modifications may be made. For example, communication channels can be implemented as wired and/or wireless connections. The communication paths established by these connections can be divided in time, frequency, phase, or otherwise. Missing switching commands can be avoided in a variety of different ways, even in high power switching applications. For example, optical techniques can be used to transmit signals. Accordingly, other implementations are within the scope of the following claims.

The present invention is defined in the claims; however, it should be understood that the present invention can alternatively be defined in accordance with the following examples.

Example 1. A power switching system comprising: a plurality of power switching units each including a respective power switch; a communication system configured to convey a system-wide switching command to the power switching units along a communication channel; and circuitry, included in each of the power switching units, that is configured to delay execution of the system-wide switching command by a delay.

Example 2. The power switching system of example 1, wherein the delay is between 0 and 1000 nanoseconds.

Example 3. The power switching system of example 1 or 2, wherein the delay is a fraction less than one of an inherent rise time or fall time of a control terminal of the respective power switch in the power switching system.

Example 4. The power switching system of any one of examples 1 to 3, wherein the power switching system includes circuitry for determining magnitudes of delays that are to be applied to the execution of the system-wide switching command by at least some of the plurality of power switching units.

Example 5. The power switching system of example 4, wherein the circuitry for determining the magnitudes of the delays is configured to determine the magnitudes of the delays on a switching cycle-by-switching cycle basis.

Example 6. The power switching system of example 4, wherein: each of the power switching units includes sense circuitry configured to sense voltages between main terminals; and the circuitry for determining the magnitudes of the delays comprises circuitry for comparing times needed for the sensed voltages at the different power switching units to reach or cross a threshold during a switching transition that is responsive to a previous system-wide switching command, or circuitry for comparing values of the sensed voltages at the different power switching units at a time defined with respect to a previous system-wide switching command.

Example 7. The power switching system of example 6, wherein each of the plurality of power switching units comprises a synchronizable clock configured to produce a clock signal, and wherein each of the power switching units is configured to reference either the times needed for the sensed voltages at the different power switching units to reach or cross a threshold, or the time defined with respect to a previous system-wide switching command to the synchronized clock signal.

Example 8. The power switching system of example 6, wherein the circuitry for determining the magnitudes of the delays is configured to determine delays that either reduce differences between the times needed for the sensed voltages at the different power switching units to reach or cross the threshold or reduce differences between the values of the sensed voltages at the time.

Example 9. The power switching system of any one of examples 1 to 8, wherein the system-wide switching command is a clock signal having different frequencies; and the delay is expressed in communications between the power switching units in terms of cycles of one of the frequencies of the clock signal.

Example 10. The power switching system of example 1, wherein magnitudes of the delays by which execution of the system-wide switching command is delayed differ in each of the plurality of power switching units.

Example 11. A power switching system comprising: a communications bus; a master power switching unit and a plurality of slave power switching units coupled to the communications bus, wherein each of the master and slave power switching units includes a power switch, sense circuitry configured to sense voltages between main terminals of the power switch, and a communications interface coupled to the communications bus, and wherein each of the slave power switching units includes control circuitry configured to transmit, using the communications interface, a signal that includes information characterizing the sensed voltages to the master power switching unit, and wherein the power switching system includes circuitry configured to receive the information characterizing the sensed voltages at the slave power switching units and compare the sensed voltages at the slave power switching units with the sensed voltages between main terminals at the power switch of the master power switching unit to determine an adjustment to be applied to a switching transition during a subsequent switching cycle by a first of the slave power switching units, and further wherein the master power switching unit includes circuitry for transmitting, using the communications interface and to the first of the slave power switching units, a signal characterizing the adjustment.

Example 12. The power switching system of example 11, wherein the delay is between 0 and 1000 nanoseconds.

Example 13. The power switching system of example 11 or 12, wherein the delay is a fraction less than one of an inherent rise time or fall time of a control terminal of the respective power switch in the power switching system Example 14. The power switching system of any one of examples 11 to 13, further comprising a system controller configured to provide a system-wide switching command that indicates a desired ON or OFF state of the master power switching unit and the plurality of slave power switching units and the adjustment is to be applied to the system-wide switching command.

Example 15. The power switching system of example 14, wherein the system controller includes the circuitry that is configured to receive the information characterizing the sensed voltages at the slave power switching units and compare the sensed voltages to determine the adjustment.

Example 16. The power switching system of example 14, wherein the adjustment is a configured to reduce a delay between the system-wide switching command and the execution of the system-wide switching command by the at least one power switch.

Example 17. A method comprising: sensing voltages between the main terminals of a plurality of power switches in a power switching system; determining either times needed for the sensed voltages to reach or cross a threshold during a switching transition that is responsive to a system-wide switching command, or values of the sensed voltages at a time defined with respect to the system-wide switching command; determining, for a first of the power switches in the power switching system, an adjustment to be applied to execution of the system-wide switching command in a subsequent switching cycle; and at a driver of the first power switch, applying the adjustment to the execution of the system-wide switching in the subsequent switching cycle.

Example 18. The method of example 17, wherein the subsequent switching cycle is a next, immediately subsequent switching cycle.

Example 19. The method of example 17 or 18, wherein the adjustment is determined to unbalance current carried by the power switches in the power switching system.

Example 20. The method of any one of examples 17 to 19, wherein the adjustment is a configured to reduce a delay between the system-wide switching command and the execution of the system-wide switching command by the at least one power switch.

Example 21. The method of any one of examples 17 to 20, wherein the adjustment is between 0 and 1000 nanoseconds.

Example 22. The method of any one of examples 17 to 21, wherein the delay is a fraction less than one of an inherent rise time or fall time of a control terminal of the respective power switch in the power switching system Example 23. The method of any one of examples 17 to 22, wherein the method further comprises: determining, for a second of the power switches in the power switching system, a second adjustment to be applied to execution of the system-wide switching command in the subsequent switching cycle, wherein the first adjustment differs from the second adjustment; and at a driver the second power switch, applying the adjustment to the execution of the system-wide switching in the subsequent switching cycle.

Example 24. The method of any one of examples 17 to 23, wherein the system-wide switching command is a clock signal having different frequencies; and the adjustment is expressed in terms of cycles of one of the frequencies of the clock signal.

Example 25. The method of any one of examples 17 to 24, wherein either the times needed for the sensed voltages to reach or cross the threshold or the time defined with respect to the system-wide switching command are referenced to a clock signals that are synchronized with clock signals of other of the power switches in the power switching system.

Example 26. A power switching unit comprising: a power switch; sense circuitry configured to sense voltages between main terminals of the power switch; and a communications interface configured to be coupled to a communications bus; circuitry configured to receive information characterizing sensed voltages at a plurality of other power switching units and compare the sensed voltages at the other power switching units with the sensed voltages between main terminals at the power switch to determine adjustments to be applied to switching transitions during a subsequent switching cycle by the other power switching units; and circuitry for transmitting, using the communications interface and to the other power switching units, signals characterizing the adjustments.

What is claimed is:

1. A power switching system comprising:
  a plurality of power switching units coupled in parallel, each of the power switching units including
    a respective power switch and
    sense circuitry configured to sense voltages between main terminals of the respective power switch;
  a communication system configured to convey a system-wide switching command to the power switching units along a communication channel;
  circuitry for determining magnitudes of delays that are to be applied to the execution of the system-wide switching command the plurality of power switching units, wherein each of the delays is tailored to a respective power switching unit and the circuitry for determining the magnitudes of the delays comprises
    circuitry for comparing times needed for the sensed voltages at the different power switching units to reach or cross a threshold during a switching transition that is responsive to a previous system-wide switching command, or
    circuitry for comparing values of the sensed voltages at the different power switching units at a time defined with respect to a previous system-wide switching command, and
  circuitry, included in each of the power switching units, that is configured to delay execution of the system-wide switching command by the delay that is tailored to that power switching unit.

2. The power switching system of claim 1, wherein the circuitry for determining the magnitudes of the delays is configured to determine the magnitudes of the delays on a switching cycle-by-switching cycle basis.

3. The power switching system of claim 1, wherein each of the plurality of power switching units comprises a synchronizable clock configured to produce a clock signal, and wherein each of the power switching units is configured to reference either
  the times needed for the sensed voltages at the different power switching units to reach or cross a threshold, or
  the time defined with respect to a previous system-wide switching command to the synchronized clock signal.

4. The power switching system of claim 3, wherein the circuitry for determining the magnitudes of the delays is configured to determine delays that either reduce differences between the times needed for the sensed voltages at the different power switching units to reach or cross the threshold or reduce differences between the values of the sensed voltages at the time.

5. The power switching system of claim 1, wherein
the system-wide switching command is a clock signal having different frequencies; and
the delay is expressed in communications between the power switching units in terms of cycles of one of the frequencies of the clock signal.

6. The power switching system of claim 1, wherein magnitudes of the delays by which execution of the system-wide switching command is delayed differ in each of the plurality of power switching units.

7. The power switching system of claim 1, wherein:
the communication system comprises a communications bus;
the plurality of power switching units includes a master power switching unit and a plurality of slave power switching units coupled to the communications bus, wherein each of the master and slave power switching units includes
a power switch,
sense circuitry configured to sense voltages between main terminals of the power switch, and
a communications interface coupled to the communications bus, and
wherein each of the slave power switching units includes
control circuitry configured to transmit, using the communications interface, a signal that includes information characterizing the sensed voltages to the master power switching unit, and
wherein the power switching system includes circuitry configured to receive the information characterizing the sensed voltages at the slave power switching units and compare the sensed voltages at the slave power switching units with the sensed voltages between main terminals at the power switch of the master power switching unit to determine an adjustment to be applied to a switching transition during a subsequent switching cycle by a first of the slave power switching units, wherein the adjustment is tailored to the first of the slave power switching units, and
further wherein the master power switching unit includes circuitry for transmitting, using the communications interface and to the first of the slave power switching units, a signal characterizing the adjustment.

8. The power switching system of claim 7, further comprising a system controller configured to provide a system-wide switching command that indicates a desired ON or OFF state of the master power switching unit and the plurality of slave power switching units and the adjustment is to be applied to the system-wide switching command.

9. The power switching system of claim 8, wherein the system controller includes the circuitry that is configured to receive the information characterizing the sensed voltages at the slave power switching units and compare the sensed voltages to determine the adjustment.

10. The power switching system of claim 8 wherein the adjustment is configured to reduce a delay between the system-wide switching command and the execution of the system-wide switching command by the at least one power switch.

11. The power switching system of claim 1, wherein the adjustment is between 0 and 1000 nanoseconds.

12. The power switching system of claim 1, wherein the delay is a fraction less than one of an inherent rise time or fall time of a control terminal of the respective power switch in the power switching system.

13. A method comprising:
sensing voltages between the main terminals of a plurality of power switches coupled in parallel in a power switching system;
determining either
times needed for the sensed voltages to reach or cross a threshold during a switching transition that is responsive to a system-wide switching command, or
values of the sensed voltages at a time defined with respect to the system-wide switching command;
determining, for a first of the power switches in the power switching system, an adjustment to be applied to execution of the system-wide switching command in a subsequent switching cycle, wherein the adjustment is tailored to the first of the power switches; and
at a driver of the first power switch, applying the adjustment to the execution of the system-wide switching in the subsequent switching cycle.

14. The method of claim 13, wherein either:
a) the subsequent switching cycle is a next, immediately subsequent switching cycle; or
b) the adjustment is determined to unbalance current carried by the power switches in the power switching system; or
c) both a) and b).

15. The method of claim 13, wherein the adjustment is a configured to reduce a delay between the system-wide switching command and the execution of the system-wide switching command by the at least one power switch.

16. The method of claim 13, wherein
the adjustment is between 0 and 1000 nanoseconds.

17. The method of claim 13, wherein the method further comprises:
determining, for a second of the power switches in the power switching system, a second adjustment to be applied to execution of the system-wide switching command in the subsequent switching cycle, wherein the first adjustment differs from the second adjustment; and
at a driver the second power switch, applying the adjustment to the execution of the system-wide switching in the subsequent switching cycle.

18. The method of claim 13, wherein
the system-wide switching command is a clock signal having different frequencies; and
the adjustment is expressed in terms of cycles of one of the frequencies of the clock signal.

19. The method of claim 13, wherein either the times needed for the sensed voltages to reach or cross the threshold or the time defined with respect to the system-wide switching command are referenced to a clock signals that are synchronized with clock signals of other of the power switches in the power switching system.

20. The method of claim 13, wherein the delay is a fraction less than one of an inherent rise time or fall time of a control terminal of the respective power switch in the power switching system.

* * * * *